United States Patent [19]

Rühle

[11] Patent Number: 4,503,709
[45] Date of Patent: Mar. 12, 1985

[54] PRESSURE SENSOR

[75] Inventor: Wolfgang Rühle, Erlangen, Fed. Rep. of Germany

[73] Assignee: Siemens Aktiengesellschaft, Munich, Fed. Rep. of Germany

[21] Appl. No.: 472,489

[22] Filed: Mar. 7, 1983

[30] Foreign Application Priority Data

Mar. 31, 1982 [DE] Fed. Rep. of Germany ....... 3211968

[51] Int. Cl.$^3$ ............................................. G01L 9/06
[52] U.S. Cl. ................................. 73/727; 73/DIG. 4; 310/338; 310/360; 338/4
[58] Field of Search ................ 73/DIG. 4, 721, 727, 73/754; 338/4, 42; 310/324, 338, 360

[56] References Cited

FOREIGN PATENT DOCUMENTS 0006890 1/1972 Japan ........................................ 338/4
0037756 9/1977 Japan ........................................ 338/4

OTHER PUBLICATIONS

Philips Technische Rundschau 33, 1973/74, No. 1, pp. 15 to 22.

*Primary Examiner*—Donald O. Woodiel
*Attorney, Agent, or Firm*—Kenyon & Kenyon

[57] ABSTRACT

A pressure sensor having a semiconductor body is disclosed. The sensor comprises a substrate of a compound semiconductor and an epitaxial layer of a mixed crystal, in which different conduction band minima with different effective masses are closely adjacent energywise, particularly from the mixed crystal series gallium-aluminum-arsenic with the composition $Ga_{1-x}Al_xAs$, in which the aluminum concentration is $0.19 \leq x \leq 0.43$. The sensor described has a simplified design and predetermined pressure ranges can be set by varying the concentration of the crystal constituents.

18 Claims, 4 Drawing Figures

PRESSURE SENSOR

BACKGROUND OF THE INVENTION

The present invention relates to a pressure sensor having a semiconductor body.

The purpose of sensors is to pick up events in a predominantly technical, although usually not electrical environment and to convert them into electrical signals. As is well known, the deformation of a strain gage caused by pressure influences its electric resistance. If the relationship between the deformation and the pressure is known, the unknown pressure can be determined by measuring the resistance change. Monocrystalline semiconductor material, particularly n-conducting silicon, is suited for this purpose because of its particular elasticity. The semiconductor body has the form of a diaphragm, on the surface of which the strain gage strip is prepared, generally in planar technology, by diffusing suitable doping substances. High-purity monocrystalline semiconductor material obeys Hook's law over a fairly wide range of strain values. The proportionality between the attacking force and the strain in the same direction remains effective up to an elongation of about 1%. In addition, the monocrystalline semiconductor material is free of hysteresis phenomena and remains elastic up to temperatures of several hundred degrees C. Furthermore, the piezo-resistance effect is particularly large in the monocrystalline semiconductor material. Therefore, correspondingly large changes of the resistivity are obtained by mechanical stress.

In one known embodiment of a miniature pressure transducer, a disc-shaped semiconductor body is provided, the flat sides of which extend preferably parallel to the (111)-plane of the crystal and which is provided at its surface with diffused-in electrically conductive zones, which serve as strain gage strips and can advantageously form four resistors of a bridge circuit. The silicon disc serves as a diaphragm and is surrounded by an enlarged rim. The resistor bands change their electric resistance as a function of the deflection of the diaphragm. The change of the resistance is a measure of the pressure acting on the diaphragm. See, for example, Philips Technische Rundschau 33, 1973/74, No. 1, pages 15 to 22.

It is an object of the present invention to improve the known pressure sensors, and, in particular, to simplify their design and allow for the setting of predetermined pressure ranges.

SUMMARY OF THE INVENTION

These and other objects of the present invention are achieved in a pressure sensor having a semiconductor body in which a mixed crystal having different conduction band minima with different effective masses are closely adjacent energy-wise. With these mixed crystals, the design of the pressure sensor becomes particularly simple. In a particular embodiment of the pressure sensor, the semiconductor body comprises a ternary or quaternary III-V compound semiconductor, for instance, gallium-aluminum-arsenic with the composition $Ga_{1-x}Al_x As$ or gallium-arsenic-phosphorus with the composition $GaAs_{1-y}P_y$ as the ternary III-V compound semiconductor and, for instance, gallium-indium-arsenic-phosphorus with the composition $Ga_{1-x}In_xAs_{1-y}P_y$ as a quaternary III-V compound semiconductor. A particularly advantageous further embodiment of the pressure sensor has the semiconductor body comprising the mixed crystal series gallium-aluminum-arsenic with the composition $Ga_{1-x}Al_xAs$, in which the aluminum concentration is $0.19 \leq x \leq 0.43$, or the mixed crystal series gallium-arsenic-phosphorus with the commposition $GaAs_{1-y}P_y$, wherein the phosphorus concentration is $0.25 \leq y \leq 0.45$. A predetermined pressure range can thereby be set by the aluminum concentration x or the phosphorus concentration y. The pressure sensor can furthermore be used also at higher ambient temperatures, particularly at several hundred degrees C.

BRIEF DESCRIPTION OF THE DRAWINGS

The invention will be described in further detail in the following detailed description, with reference to the drawings, in which.

DETAILED DESCRIPTION

Figure 1:
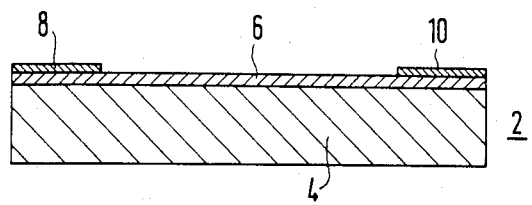
FIG. 1 is a longitudinal sectional view of the pressure sensor according to the present invention.

With reference now to the drawings, FIG. 1 shows an embodiment of a pressure sensor having a semiconductor body 2 of a semi-insulating gallium-arsenide substrate 4 which has a high resistance due to doping substances, for instance, oxygen or chromium. On its upper surface, an epitaxial layer 6 is grown which comprises the mixed crystal series gallium-aluminum-arsenic with the composition $Ga_{1-x}Al_xAs$. The aluminum concentration x may be, for instance, $0.19 \leq x \leq 0.43$. In order to measure pressure in the pressure range from 6 kbar to 12 kbar, the aluminum concentration is preferably about 0.4, and in particular, the aluminum concentration x is approximately 0.3 for measuring pressure in the pressure range from 0 kbar to 8 kbar. Contact is established at the respective ends of the epitaxial layer 6 by ohmic contacts 8 and 10 which may comprise, for instance, gold-germanium alloys or several alloy layers, for instance, a gold-germanium alloy, a nickel-chromium alloy and gold. The epitaxial layer 6 can alternatively comprise a mixed crystal from the series gallium-arsenic-phosphorus with the composition $GaAs_{1-y}P_y$, wherein the phosphorus concentration y is, for instance, $0.25 \leq y \leq 0.45$ and preferably $0.3 \leq y \leq 0.35$. In order to measure pressure in the range of about 0 to 6 kbar, the phosphorus concentration y can be chosen in particular as about 0.33.

By using the mixed crystals $Ga_{1-x}Al_xAs$ or $GaAs_{1-y}P_y$ as the epitaxial layer 6, the resistance-pressure characteristic is linear over a wide range. In this range, the resistance depends very greatly on uniaxial or also hydrostatic pressure. This resistance-pressure characteristic, which is linear over a wide range, is caused by the change of the distribution of a nearly constant number of electrons between the direct $\Gamma-$ and the indirect X and L minima with respectively different mobilities. This pressure sensor having the mixed crystal can be used for measuring at high ambient temperatures up to, for instance, about 770° K. because its intrinsic conductivity up to this temperature remains very low due to the large energy gap. By means of the aluminum concentration x or the phosphorus concentration y, a predetermined pressure range can be set because the resistance-pressure characteristic is linear over wide ranges.

Figure 2:
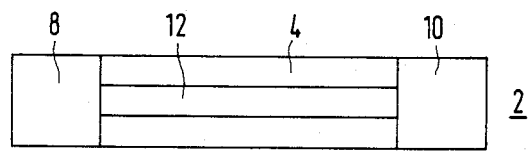
FIG. 2 is a top view of the sensor shown in FIG. 1.

FIG. 2 is a top view of the pressure sensor, in which a resistance band 12 and contact areas of the ohmic contacts 8 and 10 are produced on the epitaxial layer 6 by means of a photographic etching technique, for instance. The resistance band 12 is generally substantially longer than it is wide. It may be, for instance, about 10 $\mu$m wide and 100 $\mu$m long. In some circumstances it may be advantageous to make the dimensions substantially larger, for instance, with a width of 100 $\mu$m and a length of about 2000 $\mu$m. The thickness of the resistance run 12 may be chosen, for instance, as 1 $\mu$m to 20 $\mu$m. The width of the ohmic contacts 8 and 10 is, for instance, about 50 $\mu$m to 500 $\mu$m. Using this design, large contact areas of the ohmic contacts 8 and 10 are obtained and accordingly, a low contact resistance and a small high-resistance resistance band 12 may be obtained. This prevents influences on the measurement results which can be caused, for instance, by connecting leads.

In a particularly simple embodiment of the pressure sensor, the resistance band 12 can extend over the entire width of the substrate.

Figure 3:
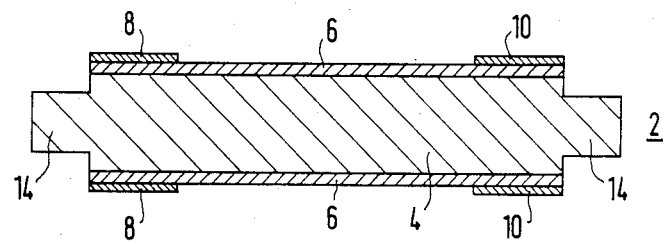
FIG. 3 is a longitudinal sectional view of a further embodiment of the pressure sensor.

In a further embodiment of a pressure sensor, as shown in FIG. 3, the semiconductor body 2 comprises a semi-insulating gallium-arsenide substrate 4 which has a high resistance by means of doping substances, for instance, oxygen or chromium. The opposite flat sides of the substrate 4 are each provided with an epitaxial layer 6 which may comprise the mixed crystal series gallim-aluminum-arsenic with the composition $Ga_{1-x}Al_xAs$. Contact is established at the respective ends of the epitaxial layers 6 by ohmic contacts 8 and 10 which may comprise, for instance, gold-germanium alloys or several alloy layers, for instance, a gold-germanium alloy, a nickel-chromium alloy and gold. The end faces of the subtrate 4 may preferably be designed as respective extensions 14.

By using the mixed crystals $Ga_{1-x}Al_xAs$ or $GaAs_{1-y}P_y$ as the epitaxial layer 6, a predetermined pressure range can be chosen in which the resistance-pressure characteristic is linear. Using this design, the possibility exists for measuring two different pressures simultaneously, for instance, the pressure in a vessel and the pressure outside the vessel.

Figure 4:
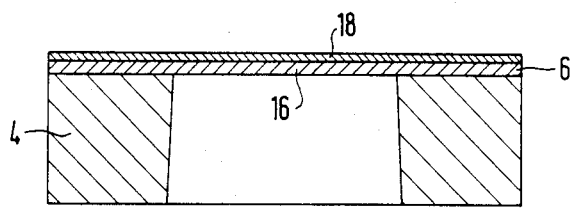
FIG. 4 is a side sectional view of a further embodiment of the pressure sensor having a diaphragm.

In FIG. 4, a miniature pressure transducer having a diaphragm 16 is shown, which comprises, for instance, a small p-conducting epitaxial layer 6. This epitaxial layer 6 which may comprise the mixed crystal series gallium-alluminum-arsenic with the composition $Ga_{1-x}Al_xAs$ or of the series gallium-arsenic-phosphorus with the composition $GaAs_{1-y}P_y$, is grown on a semi-insulating gallium-arsenide substrate 4 which is formed by selective etching into a support ring. On the epitaxial layer 6, a second n-conducting epitaxial layer 18 is grown which comprises a mixed crystal, for instance, $Ga_{1-x}Al_xAs$. This epitaxial layer 18 can be provided, for instance, by means of zinc diffusion or also by proton implantation with pressure-sensitive strain gage strips, not shown in the figure, which may preferably form a measuring bridge. By this design, the sensitivity of the pressure sensor is further increased substantially. The increase of the sensitivity is based not only on the diaphragm effect but additionally on the fact that the energy-wise distance of the closely adjacent minima changes more rapidly. If uniaxial pressure components occur in addition to the hydrostatic pressure component, the X and L minima are split up.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. A pressure sensor having a semiconductor body comprising a substrate comprising a compound semiconductor and a first epitaxial layer comprising a ternary or quaternary III-V compound semiconductor wherein different conduction band minima with different effective masses are closely adjacent energywise, said epitaxial layer comprising the mixed crystal series gallium-aluminum-arsenic having the composition $Ga_{1-x}Al_xAs$, wherein the aluminum concentration amounts to $0.19 \leq x \leq 0.43$.

2. The pressure sensor recited in claim 1, wherein the epitaxial layer comprises the mixed crystal series gallium-arsenic-phosphorus with the composition $GaAs_{1-y}P_y$, wherein the phosphorus concentration is $0.25 \leq y \leq 0.45$.

3. The pressure sensor recited in claim 1, wherein the substrate is a semi-insulating substrate of high resistance gallium-arsenide GaAs and the epitaxial layer comprises n-conducting gallium-aluminum-arsenic with the composition n-$Ga_{1-x}Al_xAs$, said epitaxial layer designed as a resistance band disposed on said substrate.

4. The pressure sensor recited in claim 3, wherein the resistance band is provided at its ends with ohmic contacts, the width of said contacts being substantially larger than the width of the resistance band.

5. The pressure sensor recited in claim 1, further comprising a second epitaxial layer disposed on said substrate opposite said first epitaxial layer.

6. The pressure sensor recited in claim 5, wherein said substrate includes longitudinally extending projections extending beyond the length of said first epitaxial layer.

7. The pressure sensor recited in claim 5, wherein said first and second epitaxial layers are provided at their respective ends with ohmic contacts.

8. The pressure sensor recited in claim 1, wherein said epitaxial layer comprises a diaphragm extending substantially over said entire substrate.

9. The pressure sensor recited in claim 8, wherein said substrate comprises a ring-shaped member and said epitaxial layer comprises a disc-shaped diaphragm disposed over said ring-shaped member.

10. The pressure sensor recited in claim 8, further comprising a second epitaxial layer disposed on said first epitaxial layer, said second epitaxial layer being of the opposite conduction type to said first epitaxial layer.

11. The pressure sensor recited in claim 1, wherein said substrate comprises a ring-shaped member and said epitaxial layer comprises a disc-shaped diaphragm disposed over said ring-shaped member.

12. A pressure sensor having a semiconductor body comprising a substrate comprising a compound semiconductor and a first epitaxial layer comprising a ternary or quaternary III-V compound semiconductor wherein different conduction band minima with different effective masses are closely adjacent energywise, said substrate comprising a semi-insulating substrate of high resistance gallium-arsenide GaAs and said epitaxial layer comprising n-conducting gallium-aluminumarsenic with the composition n-Ga$_{1-x}$Al$_x$As, said epitaxial layer designed as a resistance band disposed on said substrate.

13. The pressure sensor recited in claim 12, wherein the resistance band is provided at its ends with ohmic contacts, the width of said contacts being substantially larger than the width of the resistance band.

14. A pressure sensor having a semiconductor body comprising a substrate comprising a compound semiconductor and a first epitaxial layer comprising a ternary or quaternary III-V compound semiconductor wherein different conduction band minima with different effective masses are closely adjacent energywise, said substrate comprising a ring-shaped member and said epitaxial layer comprising a disc-shaped diaphragm disposed over said ring-shaped member.

15. A pressure sensor having a semiconductor body comprising a substrate comprising a compound semiconductor and a first epitaxial layer comprising a ternary or quaternary III-V compound semiconductor wherein different conduction band minima with different effective masses are closely adjacent energywise, said first epitaxial layer comprising a diaphragm extending substantially over said entire substrate and further comprisiing a second epitaxial layer disposed on said first epitaxial layer, said second epitaxial layer being of the opposite conduction type to said first epitaxial layer.

16. A pressure sensor having a semiconductor body comprising a substrate comprising a compound semiconductor and a first epitaxial layer comprising a ternary or quaternary III-V compound semiconductor wherein different conduction band minima with different effective masses are closely adjacent energywise and further comprising a second epitaxial layer disposed on said substrate opposite said first epitaxial layer.

17. The pressure sensor recited in claim 16, wherein said substrate includes longitudinally extending projections extending beyond the length of said epitaxial layer.

18. The pressure sensor recited in claim 16, wherein said first and second epitaxial layers are provided at their respective ends with ohmic contacts.

* * * * *